United States Patent
Nichols et al.

(10) Patent No.: US 6,366,598 B1
(45) Date of Patent: Apr. 2, 2002

(54) HIGH POWER SINGLE MODE SEMICONDUCTOR LASERS AND OPTICAL AMPLIFIERS USING 2D BRAGG GRATINGS

(75) Inventors: Doyle T. Nichols, Ellicott City, MD (US); Srinath Kalluri, Culver City, CA (US); Michael G. Wickham, Rancho Palos Verdes, CA (US); Timothy A. Vang, San Dimas, CA (US); Michael P. Nesnidal, Madison, WI (US); Robert W. Lodenkamper, Rancho Palos Verdes, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/247,402

(22) Filed: Feb. 10, 1999

(51) Int. Cl.$^7$ ................................................ H01S 5/125
(52) U.S. Cl. ........................................ 372/102; 372/19
(58) Field of Search ............................... 372/45, 50, 96, 372/19; 385/131

(56) References Cited

U.S. PATENT DOCUMENTS

| | | | |
|---|---|---|---|
| 3,884,549 A | | 5/1975 | Wang et al. .................. 350/96 |
| 3,970,959 A | | 7/1976 | Wang et al. ............ 331/94.5 C |
| 4,743,083 A | * | 5/1988 | Schimpe .................. 350/96.19 |
| 4,897,844 A | * | 1/1990 | Schimpe ........................ 372/26 |
| 5,131,001 A | * | 7/1992 | Carlson ........................ 372/50 |
| 5,263,041 A | * | 11/1993 | Pankove ...................... 372/45 |
| 5,663,592 A | * | 9/1997 | Miyazawa .................. 257/627 |
| 6,151,347 A | * | 11/2000 | Noel ........................... 372/45 |

FOREIGN PATENT DOCUMENTS

| | | |
|---|---|---|
| DE | 4135813 | 5/1992 |
| JP | 63-073683 | 9/1986 |
| JP | 02143581 | 11/1988 |
| JP | 11040885 | 7/1997 |

OTHER PUBLICATIONS

Suemune I et al: Room–Temperature Operation of a Transverse–Distributed–Feedback Cavity Laser, Electronics Letters, GB, IEE Stevenage, vol. 18, No. 17, Aug. 19, 1982. pp. 745–746.

Berger V: Three–Level Laser Based on Intersubband Transitions in Asymmetric Quantum Wells: A Theoretical Study Semiconductor Science and Technology, GB, Institute of Physics, London, vol. 9, No. 8, Aug. 1, 1994, pp. 1493–1499.

Baba T et al: Polarisation Changes in Spontaneous Emission from Gainasp–INP Two–Dimesional Photonic Crystals Electronics Letters, GB, IEE Stevenage, vol. 31, No. 20, Sep. 28, 1995, pp. 1776–1778.

* cited by examiner

*Primary Examiner*—James W. Davie
*Assistant Examiner*—Gioacchino Inzirillo
(74) *Attorney, Agent, or Firm*—Harness, Dickey & Pierce, P.L.C.

(57) ABSTRACT

A waveguide (10) is provided having a two-dimensional optical wavelength Bragg grating (20) embedded within a semiconductor laser medium (16). More particularly, the waveguide (10) includes an active region (16) sandwiched between n-doped and p-doped cladding layers (14, 22). The two-dimensional Bragg grating (20) is formed in the active region (16). Upper and lower electrodes (24, 26) are defined on opposite sides of the cladding layers (14, 22) to complete the waveguide structure (10). The two-dimensional grating (20) provides simultaneous frequency selective feedback for mode control in both the longitudinal and lateral directions.

16 Claims, 3 Drawing Sheets

HIGH POWER SINGLE MODE SEMICONDUCTOR LASERS AND OPTICAL AMPLIFIERS USING 2D BRAGG GRATINGS

BACKGROUND OF THE INVENTION

This invention was made with government support under a restricted contract. The government has certain rights in this invention.

1. Technical Field

The present invention generally relates to optical waveguides and, more particularly, to an optical waveguide incorporating a two-dimensional Bragg grating buried therein.

2. Discussion

Laser diodes are used in a myriad of modem applications such as communications, spectroscopy, solid state fiber lasers, fiber lasers, amplifiers, and the like. Some desirable laser diode properties for many applications are reliability, low-noise, single frequency, single spatial mode, and high optical powers.

The facets of a semiconductor laser degrade catastrophically when the optical power density at the facet reaches a critical value. Thus increasing the facet area is attractive for increasing the power output of these devices. However, large area devices fabricated using conventional processes tend to be multi-spatial mode due to the strict tolerances placed on the device dimensions. Also, conventional lasers and optical amplifiers are noisy since there are many modes available for amplified spontaneous emission.

In view of the foregoing, it would be desirable to provide a technique for increasing the area of the facet while maintaining a single mode output from the semiconductor laser.

SUMMARY OF THE INVENTION

The above and other objects are provided by a planar waveguide laser having a two-dimensional optical wavelength Bragg grating embedded within the guiding medium. More particularly, the waveguide preferably includes an active region sandwiched between n-doped and p-doped cladding layers. A two-dimensional Bragg grating is formed at the interface of the active region and one of the claddings. Upper and lower electrodes are defined on opposite sides of the cladding layers to complete the laser diode structure. As such, the two-dimensional grating structure provides frequency selective feedback for mode control simultaneously in both the longitudinal and lateral directions. Thus, this invention provides a technique for making a laser that emits into a large and single spatial mode at a single frequency.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which.

DETAILED DESCRIPTION OF THE PREFERRED EMBODIMENTS

Figure 1:
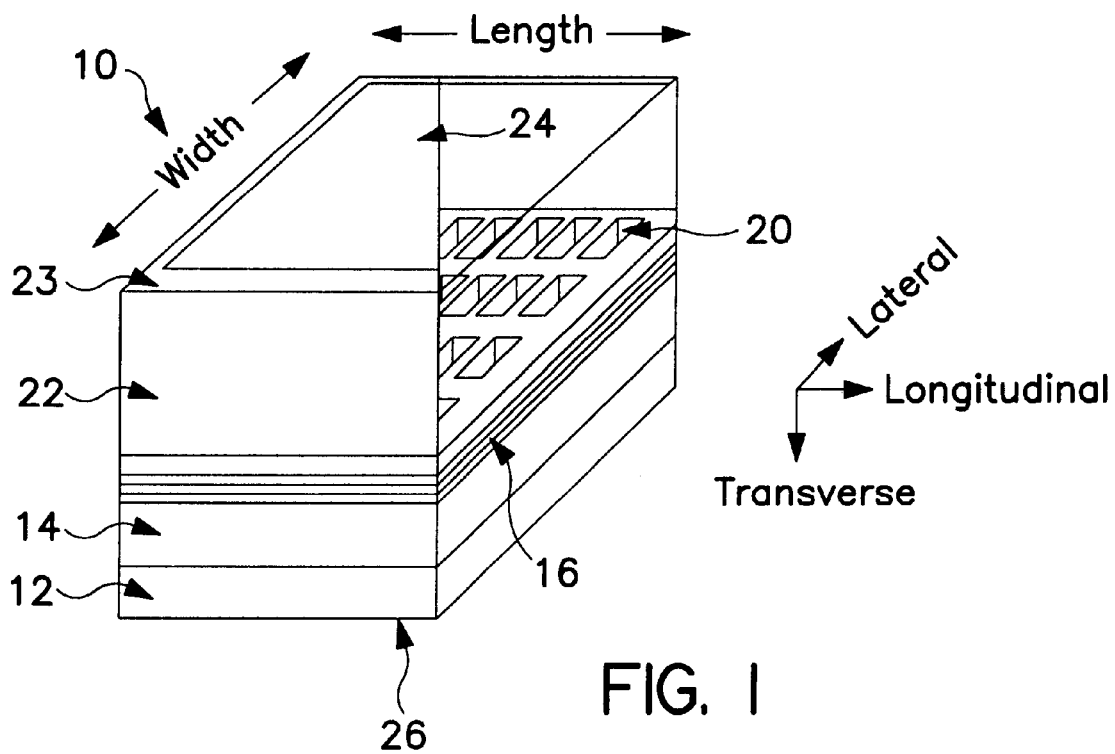
FIG. 1 is a partially cut-away perspective view of the waveguide structure of the present invention.

The present invention is directed towards a waveguide structure for a semiconductor laser or optical amplifier which includes a two-dimensional grating structure embedded in a semiconductor laser medium. The waveguide structure of the present invention has both expanded optical mode size and distributed feedback properties which allows very large optical powers and narrow optical emission linewidth. The grating structure may also restrict the mode space available for amplified spontaneous emission which greatly reduces the noise from the laser.

Turning now to the drawing figures, a waveguide structure for a semiconductor laser according to the present invention is illustrated generally at 10. The waveguide 10 includes a n-doped substrate 12 having a n-doped lower cladding layer 14 disposed thereon. A plurality of alternating layers of semiconductor material are disposed as an active region 16 on the lower cladding layer 14. The quantum wells and barriers of the active region 16 are lattice matched to the material of the substrate 12 and lower cladding layer 14. Although one skilled in the art will appreciate that other semiconductor materials may substitute therefor, it is presently preferred to form the substrate 12 and lower cladding layer 14 of Indium Phosphide (InP) while the alternating layers of the active region 16 are indium gallium arsenide phosphide (InGaAsP).

A two-dimensional grating 20 is formed in an upper surface of photoresist of the active region 16. A p-doped upper cladding layer 22 is disposed on the two-dimensional grating 20. A p+doped cap 23 is disposed on the upper cladding layer 22. An upper electrode 24 is disposed on the layer 23 while a lower electrode 26 is formed on the substrate 12. Preferably, the upper cladding layer 22 is formed of Indium Phosphide (InP) while the cap 23 is formed of indium gallium arsenide although other materials may be substituted therefor.

As can be seen in FIG. 1, the two-dimensional grating structure 20 is defined in the plane of the longitudinal and lateral directions. As such, frequency selective feedback required for mode control is provided in both the longitudinal direction and also the lateral direction. Such lateral mode control allows fabrication of devices with mode sizes much larger than the mode sizes of conventional etched ridge waveguide lasers. Furthermore, such longitudinal mode control allows fabrication of devices with single optical frequency characteristics. Thus, the waveguide 10 has both expanded optical mode size and distributed feedback properties which enables very large optical powers and narrow optical emission linewidth. The two-dimensional grating 20 may also restrict the available mode space for amplified spontaneous emission which can greatly reduce noise from the laser. By incorporating large perturbations in the index of refraction in the waveguide 10, further advantages in noise reduction are realized.

Figure 2A:
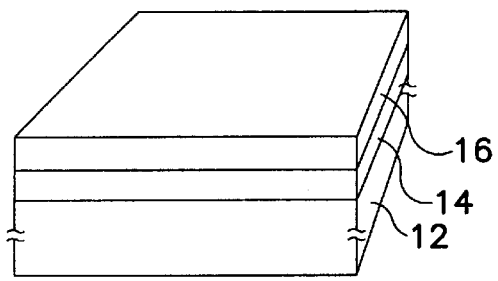
FIGS. 2A–2D are perspective views illustrating a method for forming the waveguide structure of the present invention.

Turning now to FIGS. 2A–2D, a fabrication sequence for the waveguide 10 is illustrated. For convenience, the fabrication sequence is illustrated in four steps: the grating base growth step illustrated in FIG. 2A, the two-dimensional grating fabrication step illustrated in FIG. 2B, the cladding regrowth step illustrated in FIG. 2C, and finally the metallization step illustrated in FIG. 2D. Referring now to FIG. 2A, the lower cladding layer 14 and active region 16 are deposited on the substrate 12. Preferably, the lower cladding layer 14 and active region 16 are grown by a chemical vapor deposition process such as metal organic chemical vapor deposition (MOCVD). As described above, the active region 16 preferably includes a plurality of alternating layers of indium gallium arsenide phosphide InGaAsP). Accordingly, the active region 16 may be grown to approximately 0.37 micrometers while the lower cladding layer 14 is grown to approximately 1 micrometer.

Figure 2B:
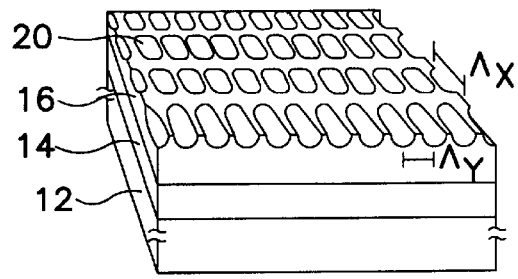

Turning now to FIG. 2B, the two-dimensional grating 20 is defined in a layer of photoresist on top of the active region 16. Preferably, one of two techniques is employed to expose the photoresist to the two-dimensional grating pattern. In one method, electron beam lithography is used. This method is often used in semiconductor processing and is very precise.

In the second method, an ultraviolet laser beam is used to create a high-fringe frequency interferrogram on the photoresist. In this way, the entire top surface of the photoresist is exposed to the hologram at one time. The orthogonal grating period is written by rotating the base structure 90° and exposing the photoresist a second time.

Figure 2C:
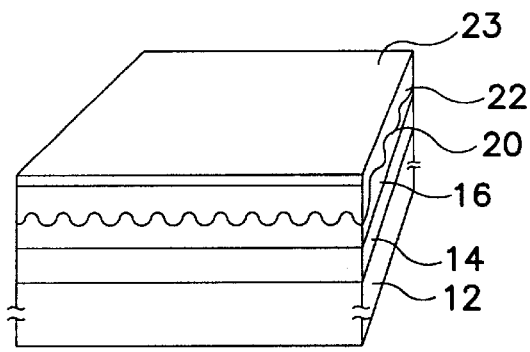
Figure 2D:
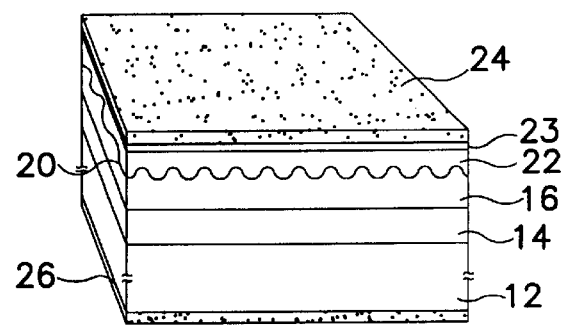

The grating patterns thus formed are preferably transferred from the photoresist into the active region by chemical wet etching. Typical dimensions of etched gratings are 50 nm depth, 220 nm short period, and 660 nm long period. Referring now to FIGS. 2C and 2D, the upper cladding layer 22 is grown on the two-dimensional grating 20 preferably by a chemical vapor deposition process such as metal organic chemical vapor deposition. The upper cladding layer 22 is preferably grown to approximately 1 micrometer thick. Thereafter, the upper and lower electrodes 24 and 26 are defined on the upper cladding layer 22 and substrate 12 respectively by lithography processing. The upper and lower electrodes 24 and 26 form contacts for current injection into the waveguide 10. As illustrated, the waveguide 10 is suitable for operating in the 1.4 micron region. Although the material system and grating period must be adjusted for other operational wavelengths, the fabrication technique will be substantially the same as described herein.

To understand the feedback properties of the waveguide 10, consider the k space representation (FIG. 3) of the two-dimensional grating 20. The grating supports only two types of lasing modes. In the first type of mode, the grating couples the $k_+$ and k waves. This is a one-dimensional mode and analogous to the mode of a conventional distributed feedback laser. The second type of mode is a superposition of four waves, $k_A$, $k_B$, $k_C$, and $k_D$ that are coupled by the grating. This is a two-dimensional mode and is thus expected to show simultaneous mode control in the lateral and longitudinal directions. The length of the k vectors for the two types of modes is different, which means that the grating provides two-dimensional feedback at a slightly different wavelength than one-dimensional feedback.

It should be noted that the composition and thickness of the quantum wells in the active region 16 may be adjusted to place the material gain peak at the wavelength of the two-dimensional feedback and thus induce lasing at this wavelength while suppressing the one-dimensional mode.

Figure 4:
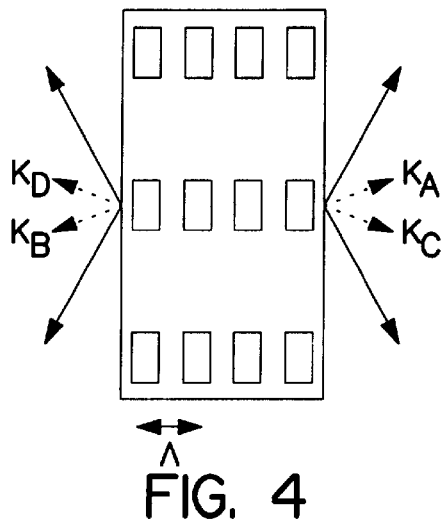
FIG. 4 is a schematic illustrating the emission angles with respect to the 2-D grating and the device facets of the present invention.

It should also be appreciated that the output direction of the emission from the waveguide 10 is not along the facet normal, but at angles defined by the k vectors inside the semiconductor medium. These angles (dotted arrows) and the exterior emission angles (solid arrows) are shown in FIG. 4.

Emission into four directions is not desirable in practice. Strong emission into one direction is preferred. High reflection coatings can suppress emission from one of the facets. At the other facet, techniques that break the symmetry of the two-dimensional structure are needed to break the remaining two-fold degeneracy of the k vectors. Three such methods will be described here.

Figure 3:
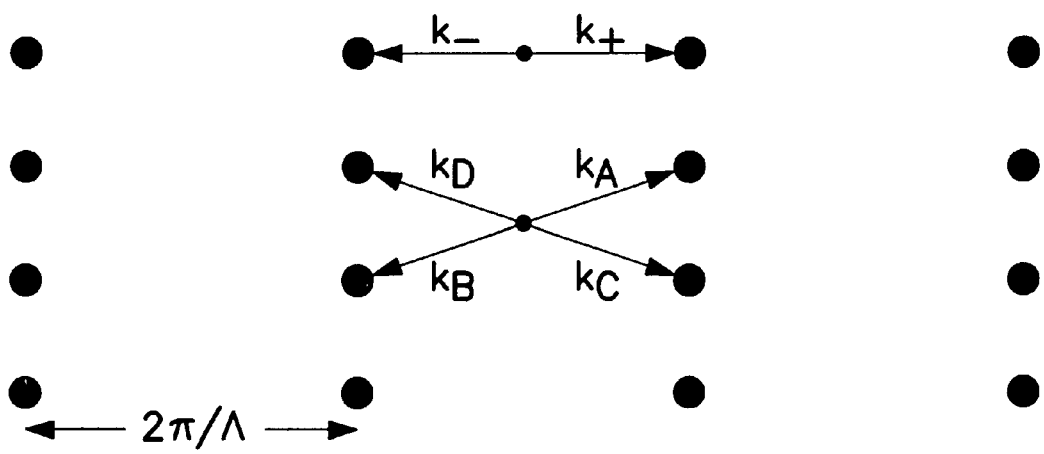
FIG. 3 is a reciprocal or k space representation of the two dimensional grating of the present invention.
Figure 5A:
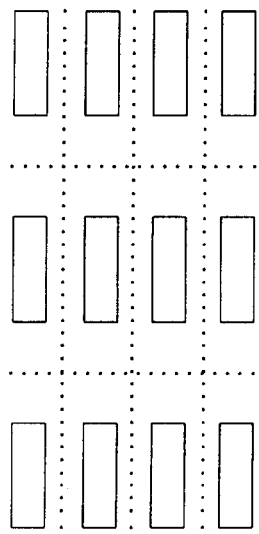
FIG. 5 is a schematic of the gratings illustrating A) grating elements that retain the symmetry of the structure, B) tilted grating elements that break the symmetry of the structure.
Figure 5B:
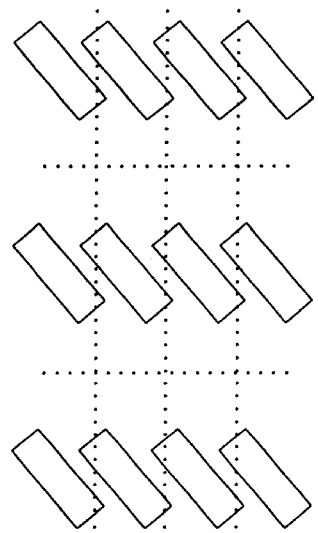

The first method for breaking the degeneracy is to "tilt" the elements of the grating with respect to the underlying two-dimensional lattice, as shown in FIG. 5B. The original "not-tilted" structure is shown for comparison in FIG. 5A. Tilting the elements breaks the symmetry of the structure since the AB and the CD diagonals in FIG. 3 are no longer equivalent directions.

The second method for breaking the symmetry is to tilt the p contact 24 along one of the k vector directions. In this technique, when current is injected into the device, one of the directions sees more gain than the other thus breaking the symmetry.

Figure 6:
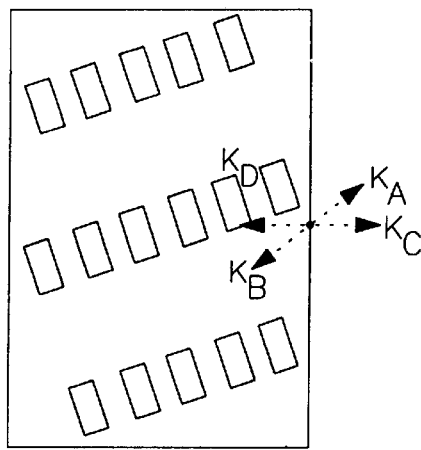
FIG. 6 is a schematic of the laser and grating structure illustrating the technique of rotating the grating lattice with respect to the facets of the device for breaking the symmetry of the structure.

The third method for breaking symmetry is to rotate the grating lattice with respect to the boundaries of the device, as shown in FIG. 6. This configuration also provides the additional advantage that the light is emitted along the face normal, unlike the other laser configurations discussed here. This is important for efficiently coupling the laser's output emission to single mode fibers.

Therefore, since, only one direction will be desired in practice, the above symmetry reduction techniques, along with the use of appropriate AR and/or HR coatings on the facets, can also help select the desired direction.

Thus, the present invention provides a high-power, single frequency, semiconductor laser waveguide tunable to the requirements of a particular application. Independent control of the laser cavity width and length (i.e., the grating area), control of the grating periods in orthogonal directions, and the ability to fabricate gratings with different two-dimensional symmetries provides fine tuning of the waveguide performance such as the output wavelength. The present invention may also provide amplified spontaneous emission noise suppression.

Although the present invention will find usefulness in a number of applications, the present invention is particularly well-suited for fiberoptic analog links, satellite communications, and CATV applications. Further, the present invention will find usefulness as a pump for erbium doped fiber lasers and amplifiers. Moreover, the present invention will find usefulness in spectroscopy, sensor applications, medical and dental applications, and many other processing technologies.

Those skilled in the art can now appreciate from the foregoing description that the broad teachings of the present invention can be implemented in a variety of forms. For example, while a specific semiconductor configuration has been described, the present invention may be employed in different laser gain environments such as chemical lasers, free electron lasers, and die lasers as well as in the design of optical amplifiers. Therefore, while this invention has been described in connection with particular examples thereof, the true scope of the invention should not be so limited since other modifications will become apparent to the skilled practitioner upon a study of the drawings, specification, and following claims.

What is claimed is:

1. A waveguide comprising:
   an active region;
   a p-doped layer formed on one side of said active region;
   an n-doped layer formed on another side of said active region; and
   a two-dimensional grating structure formed between said active region and at least one of said p-doped layer and said n-doped layer; and
   a first electrode disposed on said p-doped layer and a second electrode disposed on said n-doped layer;
   wherein an asymmetrical alignment exists between at lease one of said first and second electrodes and said grating surface.

2. The waveguide of claim 1 wherein said active region further comprises quantum wells and barriers lattice matched to said n-doped layer.

3. The waveguide of claim 1 wherein said active region further comprises alternating layers of Indium Gallium Arsenide Phosphide.

4. The waveguide of claim I wherein said p-doped layer further comprises p-doped Indium Phosphide cladding.

5. The waveguide of claim 1 wherein said n-doped layer further comprises n-doped Indium Phosphide cladding.

6. The waveguide of claim 1 further comprising a first electrode disposed on said p-doped layer and a second electrode disposed on said n-doped layer.

7. The waveguide of claim 1 wherein said asymmetric two-dimensional grating surface further comprises a plurality of grating elements individually rotated relative to said at least one of said p-doped layer and said n-doped layer.

8. The waveguide of claim 1 wherein said asymmetric two dimensional grating surface is rotated relative to the said at least one of said p-doped layer and n-doped layer.

9. A waveguide for a semiconductor laser comprising:
   a first electrode;
   a substrate disposed on said first electrode;
   a first cladding layer disposed on said substrate;
   an active layer disposed on said first cladding layer;
   a two dimensional grating surface formed on said active layer;
   a second cladding layer disposed on said two dimensional grating structure; and
   a second electrode disposed on said second cladding layer,
   wherein an asymmetrical alignment exists between at least one of said first and second electrodes and said grating surface.

10. The waveguide of claim 9 wherein said substrate further comprises n-doped Indium Phosphide.

11. The waveguide of claim 9 wherein said first cladding layer further comprises p-doped Indium Phosphide.

12. The waveguide of claim 9 wherein said active layer further comprises a plurality of layers of Indium Gallium Arsenide Phosphide.

13. The waveguide of claim 9 wherein said second cladding layer further comprises p-doped Indium Phosphide.

14. The waveguide of claim 9 wherein said second cladding layer further comprises p-doped Indium Gallium Arsenide.

15. The waveguide of claim 9 wherein said asymmetric two-dimensional grating surface further comprises a plurality of grating elements individually rotated relative to said at least one of said p-doped layer and said n-doped layer.

16. The waveguide of claim 9 wherein said asymmetric two dimensional grating surface is rotated relative to the said at least one of said p-doped layer and n-doped layer.

* * * * *